(12) United States Patent
Zheng et al.

(10) Patent No.: US 9,103,852 B2
(45) Date of Patent: Aug. 11, 2015

(54) DIRECT CURRENT SENSING CIRCUIT AND CIRCUIT INTERRUPTER INCLUDING THE SAME

(71) Applicant: EATON CORPORATION, Cleveland, OH (US)

(72) Inventors: Gerald Zheng, Shenzhen (CN); Jack Gu, Shenzhen (CN); Bruce Wu, Shenzhen (CN); Vijay Bhavaraju, Germantown, WI (US); Xin Zhou, Franklin Park, PA (US)

(73) Assignee: EATON CORPORATION, Cleveland, OH (US)

( * ) Notice: Subject to any disclaimer, the term of this patent is extended or adjusted under 35 U.S.C. 154(b) by 172 days.

(21) Appl. No.: 14/059,621

(22) Filed: Oct. 22, 2013

(65) Prior Publication Data

US 2015/0109078 A1 Apr. 23, 2015

(51) Int. Cl.
*G01R 31/02* (2006.01)
*G01R 19/00* (2006.01)
*H01H 71/12* (2006.01)

(52) U.S. Cl.
CPC .......... *G01R 19/0092* (2013.01); *H01H 71/125* (2013.01)

(58) Field of Classification Search
CPC .............................. G01R 15/181; G01R 15/183
USPC ........................... 324/424, 127, 117 R, 117 H
See application file for complete search history.

(56) References Cited

U.S. PATENT DOCUMENTS

| | | |
|---|---|---|
| 2010/0001716 A1* | 1/2010 | Serpinet et al. ............ 324/117 R |
| 2013/0162242 A1* | 6/2013 | Goinga ........................ 324/127 |

* cited by examiner

*Primary Examiner* — Vincent Q Nguyen
(74) *Attorney, Agent, or Firm* — Eckert Seamans Cherin & Mellott, LLC; Nathaniel C. Wilks

(57) ABSTRACT

A circuit for sensing a direct current includes a first resistance and a second resistance. A first portion of the direct current flows through the first resistance and a second portion of the direct current flows through the second resistance. The circuit further includes a current sensor having an opening, first and second conductors inductively coupled with the current sensor, and a switching circuit having a pair of switches structured to alternatingly switch in order that the second portion of the direct current alternatingly flows through the first and second conductors. The second portion of the direct current flowing through the first conductor passes through the opening of the current sensor in a first direction and the second portion of the direct current flowing through the second conductor passes through the opening of the current sensor in a second direction opposite to the first direction.

18 Claims, 3 Drawing Sheets

DIRECT CURRENT SENSING CIRCUIT AND CIRCUIT INTERRUPTER INCLUDING THE SAME

BACKGROUND

1. Field

The disclosed concept relates generally to current sensing circuits and, in particular, to direct current sensing circuits. The disclosed concept also relates to circuit interrupters including a current sensing circuit.

2. Background Information

Circuit interrupters, such as circuit breakers, have been used in alternating current (AC) and direct current (DC) applications. The applications for DC circuit breakers have increased with the larger use of alternative energy sources, such as photovoltaic applications. DC molded case circuit breakers have used mechanical thermal and magnetic trip units tier overload and short circuit protection, while some DC air circuit breakers employ electronic trip units. Magnetic trip units instantaneously trip the circuit breaker when the current in the protected circuit exceeds a predetermined level. However, magnetic trip units are difficult to calibrate and are not as accurate as electronic trip units. Thermal trip units are less susceptible to nuisance tripping, but take a longer amount of time to trip the circuit breaker, and are susceptible to ambient thermal conditions causing accuracy problems. Because of these (problems, thermal and magnetic trip units are not typically used in relatively larger size and higher current rated circuit breakers in AC applications, but rather, AC electronic trip units, which use a current transformer to sense the AC current, are used.

Without a time varying magnetic field, the AC current transformer will produce no electromotive force with DC current, which makes the AC electronic trip unit inoperable in DC applications. Certain DC circuit breakers, such as DC air circuit breakers, have used a DC electronic trip unit in combination with a shunt to sense the DC current in the protected circuit. The DC electronic trip unit provides enhanced control and tripping accuracy of the circuit breaker over thermal and magnetic trip units. However, DC circuit breakers which include a DC electronic trip unit are costly as compared to the high volume and readily available AC electronic trip units.

Photovoltaic applications present difficulties for DC circuit breakers. In photovoltaic applications, the short circuit current level can be relatively low (e.g., less than 200% of the rated current and usually about 125% to 135% of the rated current). Due to the relatively low short circuit current level, DC circuit breakers, which use thermal and magnetic trip units, are typically not desirable because it is difficult to set the magnetic trip unit precisely at these relatively low levels. Also, such trip units could cause excessive nuisance tripping and the thermal trip unit may not offer adequate protection due to the relatively long time it takes to trip the circuit breaker. While a DC circuit breaker which uses a DC electronic trip unit can offer suitable circuit protection in photovoltaic applications, the cost of the DC circuit breaker with a DC electronic trip unit is a concern.

There is room for improvement in circuits for sensing direct current.

There is also room for improvement in circuit interrupters, such as circuit breakers.

SUMMARY

These needs and others are met by embodiments of the disclosed concept, which provide a circuit for sensing direct current. These needs and others are also met by embodiments of the disclosed concept, which provide a circuit interrupter including a circuit for sensing direct current.

In accordance with aspects of the disclosed concept, a circuit for sensing a direct current comprises: a first resistance; a second resistance, wherein a first portion of the direct current flows through the first resistance and a second portion of the direct current flows through the second resistance; a current sensor having an opening and an output; a first conductor inductively coupled with the current sensor; a second conductor inductively coupled with the current sensor; and a switching circuit electrically connected to the second resistance and having a pair of switches structured to alternatingly switch in order that the second portion of the direct current alternatingly flows through the first conductor and the second conductor, wherein the second portion of the current flowing through the first conductor passes through the opening of the current sensor in a first direction and the second portion of the current flowing through the second conductor passes through the opening of the current sensor in a second direction opposite to the first direction.

In accordance with other aspects of the disclosed concept, a circuit interrupter for a direct current load comprises: separable contacts; an operating mechanism configured to open and close the separable contacts; an electronic trip unit configured to cooperate with the operating mechanism to trip open the separable contacts; and a direct current sensing circuit configured to sense direct current flowing through the separable contacts. The direct current sensing unit comprises: a first resistance; a second resistance, wherein a first portion of the direct current flows through the first resistance and a second portion of the direct current flows through the second resistance; a current sensor having an opening and an output; a first conductor inductively coupled with the current sensor; a second conductor inductively coupled with the current sensor; and a switching circuit electrically connected to the second resistance and including a pair of switches structured to alternatingly switch in order that the second portion of the direct current alternatingly flows through the first conductor and the second conductor, wherein the second portion of the current flowing through the first conductor passes through the opening of the current sensor in a first direction and the second portion of the current flowing through the second conductor passes through the opening of the current sensor in a second direction opposite to the first direction. The circuit interrupter also comprises a coupling circuit configured to couple the output of the current sensor with the electronic trip unit.

BRIEF DESCRIPTION OF THE DRAWINGS

A full understanding of the disclosed concept can be gained from the following description of the preferred embodiments when read in conjunction with the accompanying drawings in which.

DESCRIPTION OF THE PREFERRED EMBODIMENTS

Figure 1:
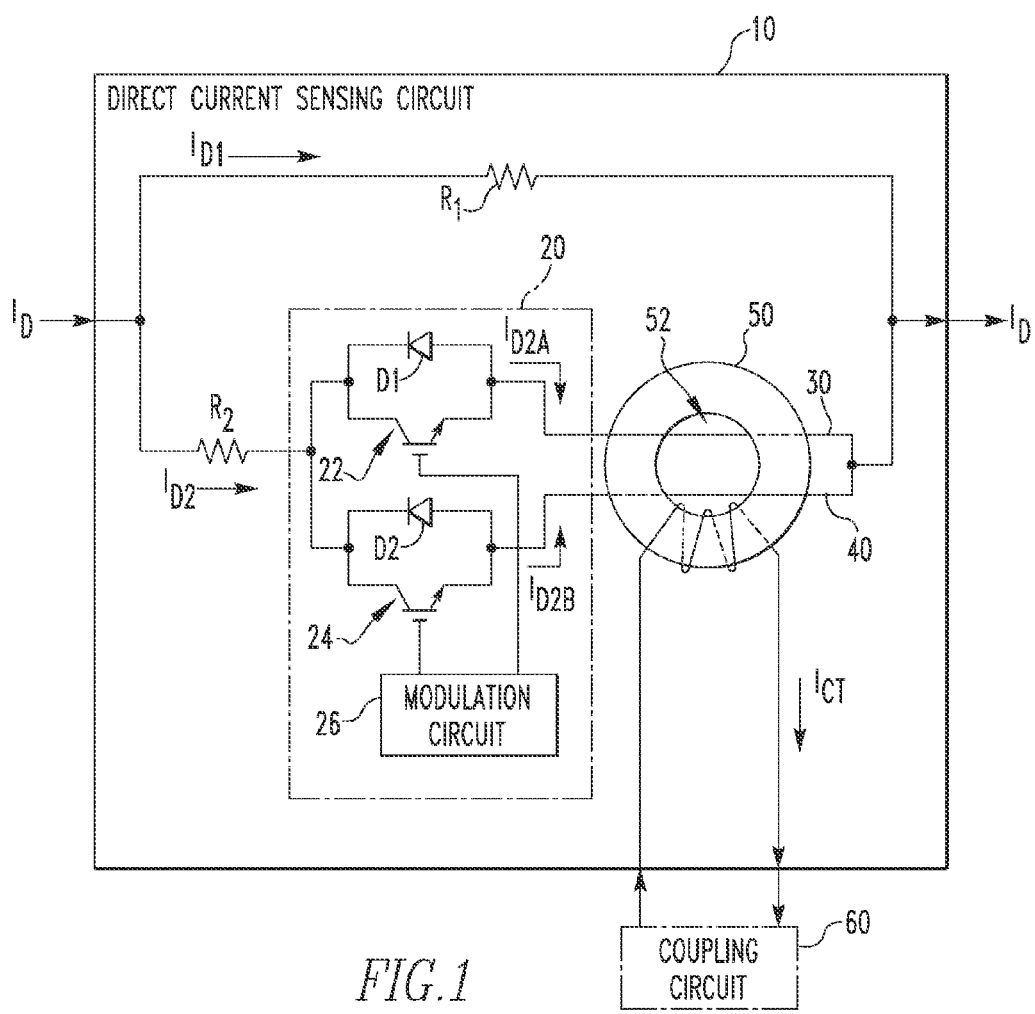
FIG. 1 is a circuit diagram in schematic form of a direct current sensing circuit in accordance with an example embodiment of the disclosed concept.

Directional phrases used herein, such as, for example, left, right, front, back, top, bottom and derivatives thereof, relate to the orientation of the elements shown in the drawings and are not limiting upon the claims unless expressly recited therein.

As employed herein, the statement that two or more parts are "coupled" together shall mean that the parts are joined together either directly or joined through one or more intermediate parts.

As employed herein, the term "number" shall mean one or an integer greater than one (i.e., a plurality).

As employed herein, the term "alternatingly" shall mean to interchange states repeatedly. For example, when first and second switches alternatingly switch, the switches repeatedly interchange (e.g., switch) between a first state where the first switch is open or off and the second switch is closed or on to a second state where the first switch is closed or off and the second switch is open or on. Similarly, when current alternatingly flows through first and second conductors in a circuit, the circuit repeatedly interchanges between a first state where the current flows through the first conductor and a second state where the current flows through the second conductor.

Referring to FIG. 1, a direct current sensing circuit 10 receives a direct current $I_D$. The direct current sensing circuit 10 includes a first branch including a first resistance $R_1$ and a second branch including a second resistance $R_2$. The direct current $I_D$ is divided between the first and second branches of the direct current sensing circuit 10. A first portion of the direct current $I_{D1}$ flows through the first resistance $R_1$ and a second portion of the direct current $I_{D2}$ flows through the second resistance $R_2$. The first resistance $R_1$ is smaller than the second resistance $R_2$. Therefore, the first portion of the direct current $I_{D1}$ is larger than the second portion of the direct current $I_{D2}$.

The direct current sensing circuit 10 further includes a switching circuit 20 electrically connected between the second resistance $R_2$ and first and second conductors 30,40. The switching circuit 20 includes a first switch 22 (e.g., without limitation, a solid-state switch such as a MOSFET) electrically connected to the first conductor 30 and a second switch 24 (e.g., without limitation, a solid-state switch such as a MOSFET) electrically connected to the second conductor 40. The switching circuit 20 may also include freewheel diodes D1,D2 electrically connected across the first and second switches 22,24, respectively, to protect the first and second switches 22,24.

The switching circuit 20 further includes a modulation circuit 26 (e.g., without limitation, a pulse width modulation circuit) which cooperates with the first and second switches 22,24 to cause them to alternatingly switch. In more detail, the modulation circuit 26 controls the first and second switches 22,24 to repeatedly switch between a first state where the first switch 22 is closed or on (i.e., conducts electricity between its drain and source) and the second switch 24 is open or off (i.e., does not conduct electricity between its drain and source) and a second state where the first switch 22 is open or off and the second switch 24 is closed or on. As a result, the second portion of the direct current $I_{D2}$ alternatingly flows through the first and second conductors 30,40. The second portion of the direct current flowing through the first conductor 30 is illustrated as $I_{D2A}$ in FIG. 1 and is hereinafter referred to as the first conductor current $I_{D2A}$. The second portion of the direct current flowing through the second conductor 40 is illustrated as $I_{D2B}$ in FIG. 1 and is hereinafter referred to as the second conductor current $I_{D2B}$.

The direct current sensing circuit 10 further includes a current sensor 50 having an opening 52 such as, for example and without limitation, a current transformer. Both the first and second conductors 30,40 are inductively coupled with the current sensor 50. The first conductor current $I_{D2A}$ passes through the opening 52 of the current sensor 50 in a first direction (e.g., without limitation, front to back with respect to FIG. 1). The second conductor current $I_{D2B}$ passes through the opening 52 of the current sensor 50 in a second direction (e.g., without limitation, back to front with respect to FIG. 1) opposite to the first direction. The first conductor current $I_{D2A}$ and the second conductor current $I_{D2B}$ induce an output current $I_{CT}$ at an output of the current sensor 50. However, the output current $I_{CT}$ induced by the first conductor current $I_{D2A}$ is opposite in direction to the output current $I_{CT}$ induced by second conductor current $I_{D2B}$. Thus, the output current $I_{CT}$ induced by the first and second conductor currents $I_{D2A}, I_{D2B}$ is a square wave alternating current signal whose amplitude is proportional to the magnitude of the direct current $I_D$ received by the direct current sensing circuit 10.

Figure 2A:
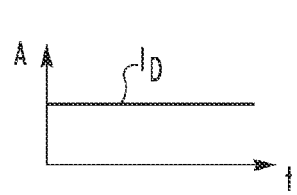
FIG. 2A is a graph of a direct current provided to the direct current sensing circuit of FIG. 1.
Figure 2B:
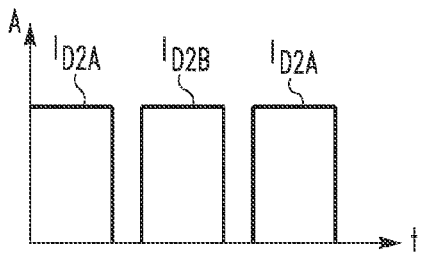
FIG. 2B is a graph of pulsating direct currents flowing in branches of the direct current sensing circuit of FIG. 1.
Figure 2C:
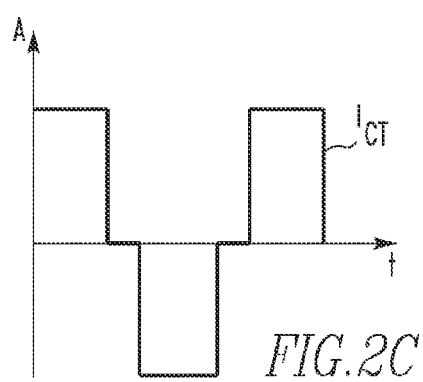
FIG. 2C is a graph of an output current of a current sensor included in the direct current sensing circuit of FIG. 1.

Referring to FIGS. 2A, 2B, and 2C, an example of the direct current $I_D$ received by the direct current sensing circuit 10, as well as the corresponding first and second conductor currents $I_{D2A}, I_{D2B}$ and the output current $I_{CT}$, are shown. As shown in FIG. 2A, the direct current $I_D$ received by the direct current sensing circuit 10 maintains a constant magnitude. Referring now to FIG. 2B, the corresponding first and second conductor currents $I_{D2A}, I_{D2B}$ alternatingly pulse. That is, when the first conductor current $I_{D2A}$ is present on the first conductor 30, the second conductor current $I_{D2B}$ is absent from the second conductor 40 and vice versa. It will be appreciated that there may be a delay between a pulse of the first conductor current $I_{D2A}$ and a pulse of the second conductor current $I_{D2B}$ by design or by factors such as, for example and without limitation, the time to operate the first and second switches 22,24. The magnitudes of the first and second conductor currents $I_{D2A}, I_{D2B}$ are approximately equal to each other and are proportional to the magnitude of the direct current $I_D$.

Referring now to FIG. 2C, the output current $I_{CT}$ corresponding to the first and second conductor currents $I_{D2A}, I_{D2B}$ is shown. The output current $I_{CT}$ is a square wave alternating current signal with a frequency corresponding to the frequency at which the first and second conductor currents $I_{D2A}, I_{D2B}$ alternatingly pulse. The amplitude of the output current $I_{CT}$ is proportional to the magnitudes of the first and second conductor currents $I_{D2A}, I_{D2B}$, and thus, can be used to determine the magnitude of the second portion of the direct current $I_{D2}$. Equations 1 and 2 can then be used to determine the magnitude of the direct current $I_D$.

$$I_D = I_{D1} + I_{D2} \quad \text{(EQ. 1)}$$

$$\frac{I_{D2}}{I_{D1}} = \frac{R_1}{R_2 + R_{DSON}} \quad \text{(EQ. 2)}$$

In Equations 1 and 2, $I_D$ is the direct current, $I_{D1}$ is the first portion of the et current that flows through the first resistance $R_1$, and $I_{D2}$ is the second portion of the direct current that flows through the second resistance $R_2$. $R_{DSON}$ is the drainto-source resistance of either of the first and second switches 22,24 when they are in the closed or on state.

Referring back to FIG. 1, the output current $I_{CT}$ is output to a coupling circuit 60. The coupling circuit 60 is configured to couple the output of the current sensor 50 with an external device such as an electronic trip unit 72, as shown in FIG. 4.

Figure 3:
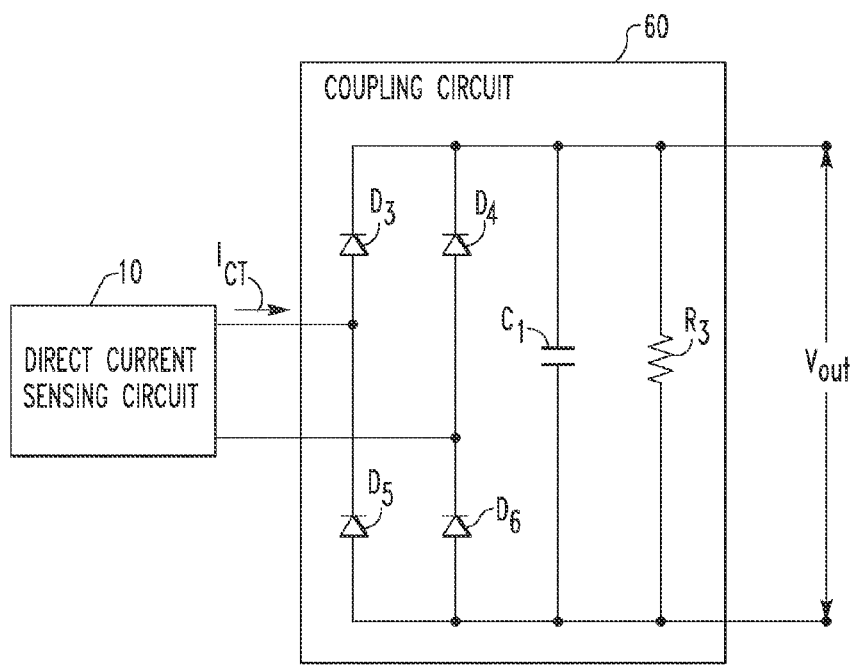
FIG. 3 is a schematic diagram of a coupling circuit in accordance with an example embodiment of the disclosed concept.

An example coupling circuit 60 is shown in FIG. 3. The example coupling circuit 60 includes a full wave rectifier having four diodes $D_3, D_4, D_5, D_6$, a capacitor $C_1$, and a resistor $R_3$. The example coupling circuit 60 FIG. 3 is configured to rectify the output current $I_{CT}$ and output a rectified output voltage $V_{OUT}$. The rectified output voltage $V_{OUT}$ can then be used by an external device, such as the electronic trip unit 72 of FIG. 4, to determine the magnitude of the second portion of the direct current $I_{D2}$ as well as to calculate the magnitude of the direct current $I_D$.

Figure 4:
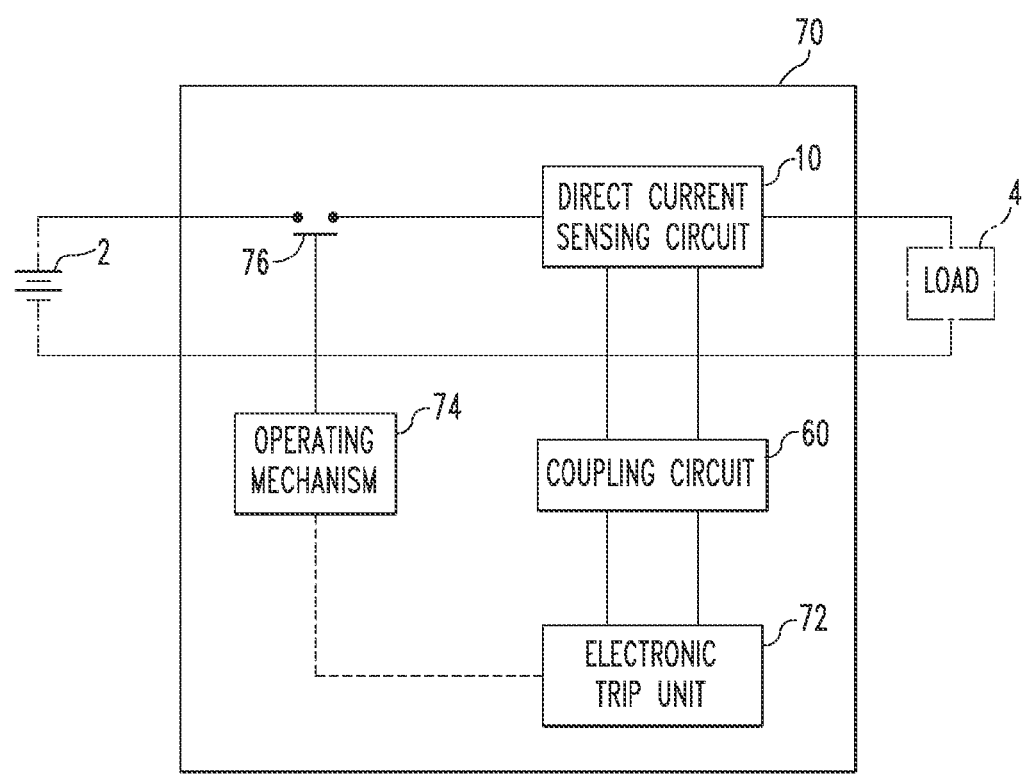
FIG. 4 is a schematic diagram of a circuit interrupter in accordance with an example embodiment of the disclosed concept.

Turning to FIG. 4, a circuit interrupter 70 (e.g., without limitation, a circuit breaker) in accordance with an example embodiment of the disclosed concept includes the direct current sensing circuit 10 and the coupling circuit 60. The circuit interrupter 70 is configured to protect a direct current power circuit including a direct current power source 2 (e.g., without limitation, a string of photovoltaic modules) (shown in phantom line drawing) and a direct current load 4 (shown in phantom line drawing). The circuit interrupter 70 includes separable contacts 76, an operating mechanism 74 structured to open and close the separable contacts 76, and the electronic trip unit 72 which cooperates with the operating mechanism 74 to trip open the separable contacts 76.

The disclosed concept is described in association with photovoltaic circuits, although the disclosed concept is applicable to a wide range of direct current applications, including, for example and without limitation, relatively higher direct current voltage circuits, such as wind power, hybrid vehicles, electric vehicles, marine systems, and aircraft. The disclosed concept is also applicable to both direct current sensing for fault protection applications as well as direct current sensing for any other suitable applications such as, for example and without limitation, monitoring or control applications.

While specific embodiments of the disclosed concept have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the disclosed concept which is to be given the full breadth of the claims appended and any and all equivalents thereof.

What is claimed is:

1. A circuit for sensing a direct current, the circuit comprising:
    a first resistance;
    a second resistance, wherein a first portion of the direct current flows through the first resistance and a second portion of the direct current flows through the second resistance;
    a current sensor having an opening and an output;
    a first conductor inductively coupled with the current sensor;
    a second conductor inductively coupled with the current sensor; and
    a switching circuit electrically connected to the second resistance and having a pair of switches structured to alternatingly switch in order that the second portion of the direct current alternatingly flows through the first conductor and the second conductor,
    wherein the second portion of the current flowing through the first conductor passes through the opening of the current sensor in a first direction and the second portion of the current flowing through the second conductor passes through the opening of the current sensor in a second direction opposite to the first direction,
    wherein the first resistance is electrically coupled between the second resistance and the first and second conductors.

2. The circuit of claim 1, wherein the pair of switches is a first switch electrically connected to the first conductor and a second switch electrically connected to the second conductor.

3. The circuit of claim 2, wherein the first and second switches are solid state switches.

4. The circuit of claim 2, wherein the switching circuit further includes a modulation circuit; and wherein the modulation circuit controls the first and second switches to alternatingly switch.

5. The circuit of claim 4, wherein the modulation circuit is a pulse width modulation circuit.

6. The circuit of claim 1, wherein the first resistance is less than the second resistance.

7. The circuit of claim 1, wherein the output of the current sensor outputs an alternating current having a magnitude proportional to the direct current.

8. The circuit of claim 1, wherein the current sensor is a current transformer.

9. A circuit interrupter for a direct current load, the circuit interrupter comprising:
    separable contacts;
    an operating mechanism configured to open and close said separable contacts;
    an electronic trip unit configured to cooperate with said operating mechanism to trip open said separable contacts;
    a direct current sensing circuit configured to sense direct current flowing through said separable contacts, the direct current sensing unit comprising:
        a first resistance;
        a second resistance, wherein a first portion of the direct current flows through the first resistance and a second portion of the direct current flows through the second resistance;
        a current sensor having an opening and an output;
        a first conductor inductively coupled with the current sensor;
        a second conductor inductively coupled with the current sensor; and
        a switching circuit electrically connected to the second resistance and including a pair of switches structured to alternatingly switch in order that the second portion of the direct current alternatingly flows through the first conductor and the second conductor,
        wherein the second portion of the current flowing through the first conductor passes through the opening of the current sensor in a first direction and the second portion of the current flowing through the second conductor passes through the opening of the current sensor in a second direction opposite to the first direction,
        wherein the first resistance is electrically coupled between the second resistance and the first and second conductors; and
    a coupling circuit configured to couple the output of the current sensor with the electronic trip unit.

10. The circuit interrupter of claim 9, wherein the coupling circuit includes a rectifier configured to rectify alternating current output by the output of the current sensor.

11. The circuit interrupter of claim 10, wherein the rectifier is a full wave rectifier.

12. The circuit interrupter of claim 9, wherein the pair of switches is a first switch electrically connected to the first conductor and a second switch electrically connected to the second conductor.

13. The circuit interrupter of claim 12, wherein the first and second switches are solid state switches.

14. The circuit interrupter of claim 12, wherein the switching circuit further includes a modulation circuit; and wherein the modulation circuit controls the first and second switches to alternatingly switch.

15. The circuit interrupter of claim 14, wherein the modulation circuit is a pulse width modulation circuit.

16. The circuit interrupter of claim 9, wherein the first resistance is less than the second resistance.

17. The circuit interrupter of claim 9, wherein the output of the current sensor outputs an alternating current having a magnitude proportional to the direct current.

18. The circuit interrupter of claim 9, wherein the current sensor is a current transformer.

* * * * *